United States Patent [19]
Schwerin

[11] Patent Number: 4,745,004
[45] Date of Patent: May 17, 1988

[54] METHOD AND APPARATUS FOR TRANSPORTING CIRCUIT OR OTHER WORK UNITS BEING PROCESSED

[76] Inventor: Thomas E. Schwerin, 2131 No. 1st St., Flagstaff, Ariz. 86001

[21] Appl. No.: 1,574

[22] Filed: Jan. 8, 1987

[51] Int. Cl.⁴ .............................................. B05D 5/12
[52] U.S. Cl. ..................... 427/96; 118/73; 118/74; 118/412; 118/423; 118/425
[58] Field of Search .................... 427/96; 118/425, 74, 118/73, 423, 412

[56] References Cited

U.S. PATENT DOCUMENTS 3,165,108  1/1965  Elliott .................................. 118/425
3,218,193  11/1965 Isaacson ............................... 118/74
4,469,716  9/1984  Caratsch .............................. 427/96

Primary Examiner—Norman Morgenstern
Assistant Examiner—Vi Duong Dang
Attorney, Agent, or Firm—Boniard I. Brown

[57] ABSTRACT

A method and apparatus for transporting work to be processed through a series of work processing stations by moving the work along a path extending past the stations to successive positions along the path opposite the stations, respectively, and at each position extending and retracting the work into and from the respective station for processing of the work therein. The present best mode practice and embodiment of the invention are designed to coat or plate the conductors and thru-holes of printed circuit boards with solder by mounting the circuit boards in rack-like work holders, transporting the work holders in succession from an infeed station to an outfeed station along a path extending over a series of tanks containing liquid baths of acid, rinse solution, flux, solder/oil and final wash, respectively, and extending and retracting each work holder downwardly into and upwardly from each tank to successively clean, rinse, flux, solder coat and wash the circuit boards.

26 Claims, 4 Drawing Sheets

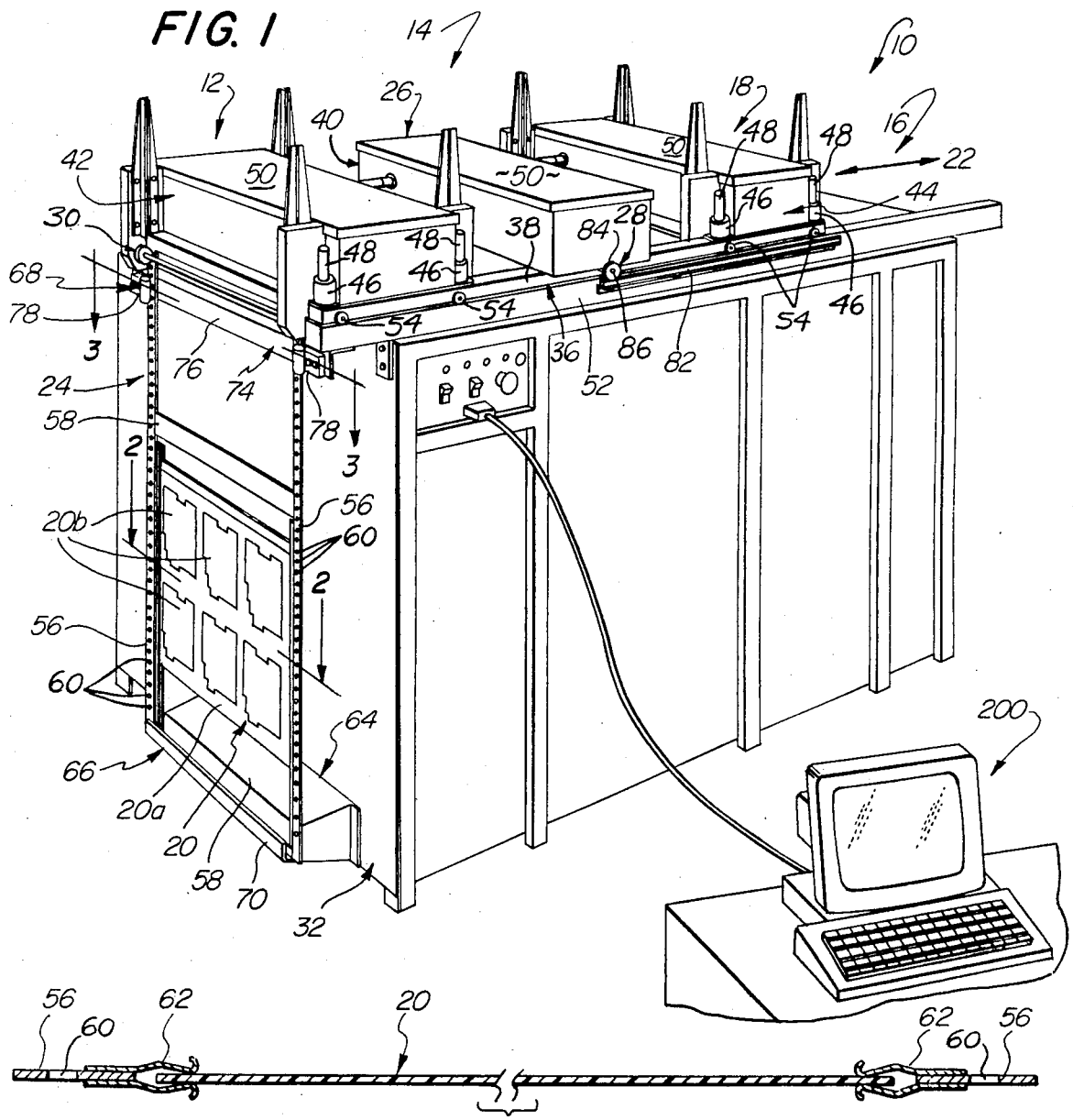
FIG. 1
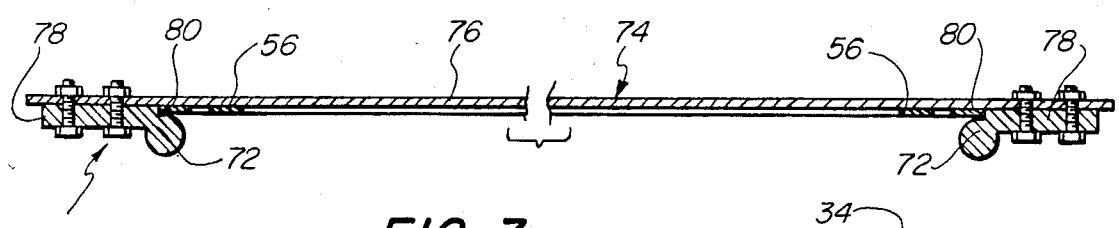
FIG. 2
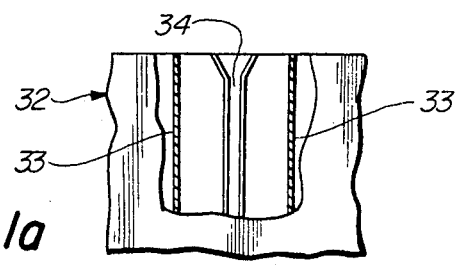
FIG. 3
FIG. 1a

FIG. 4      FIG. 4a
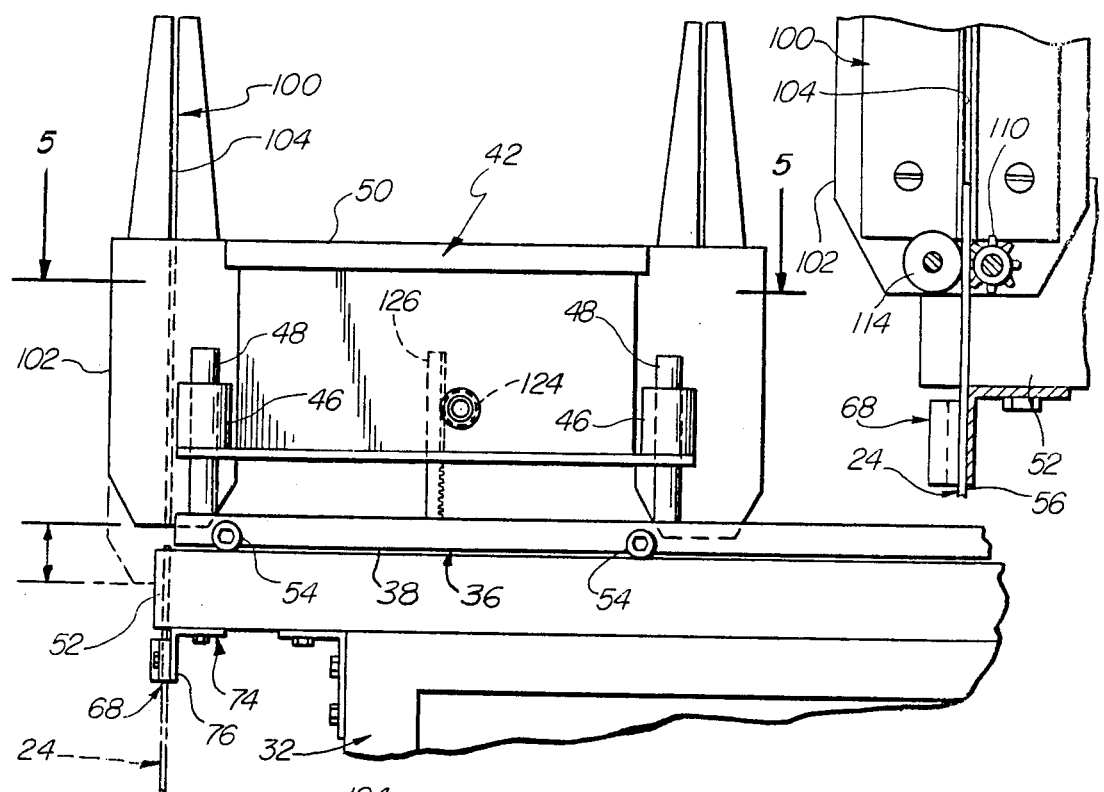
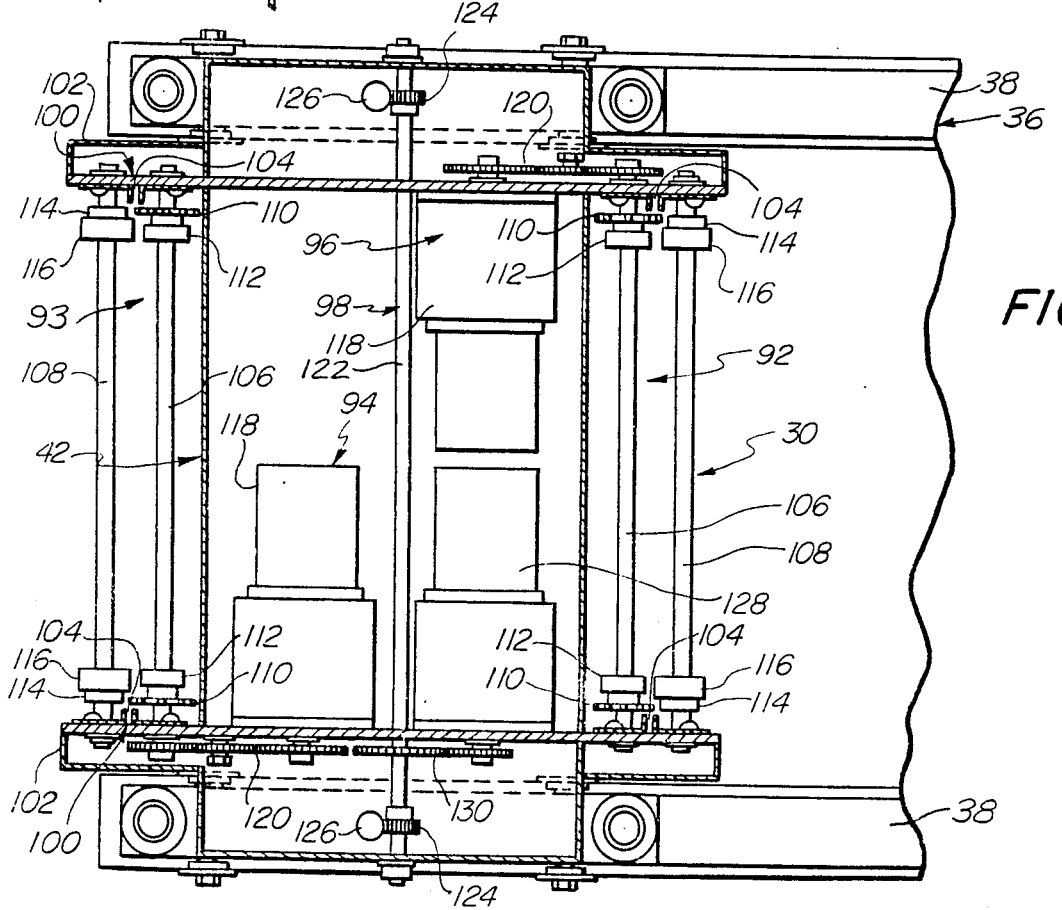
FIG. 5

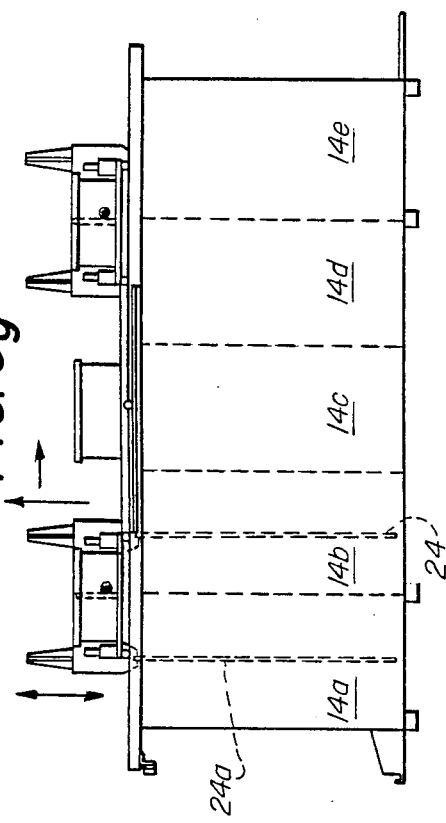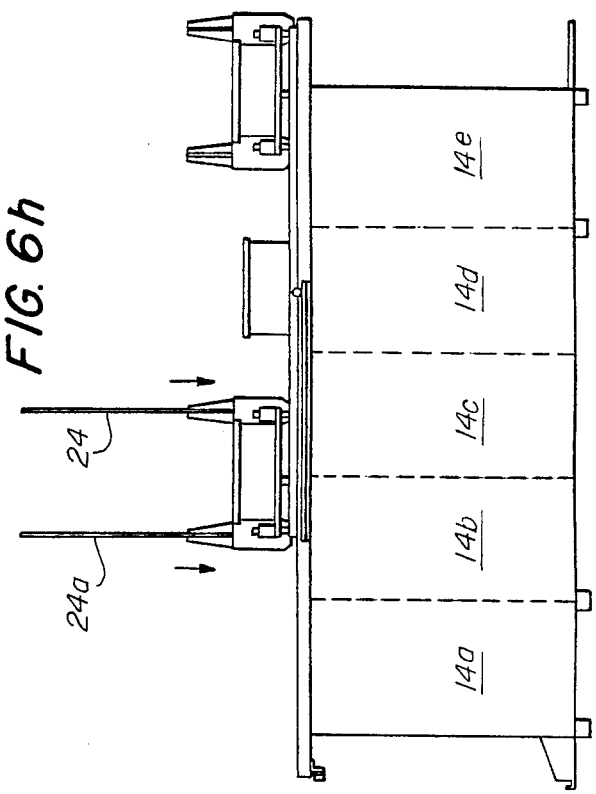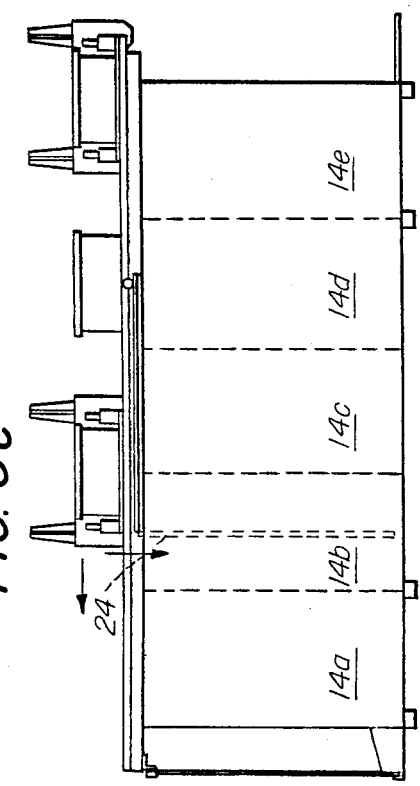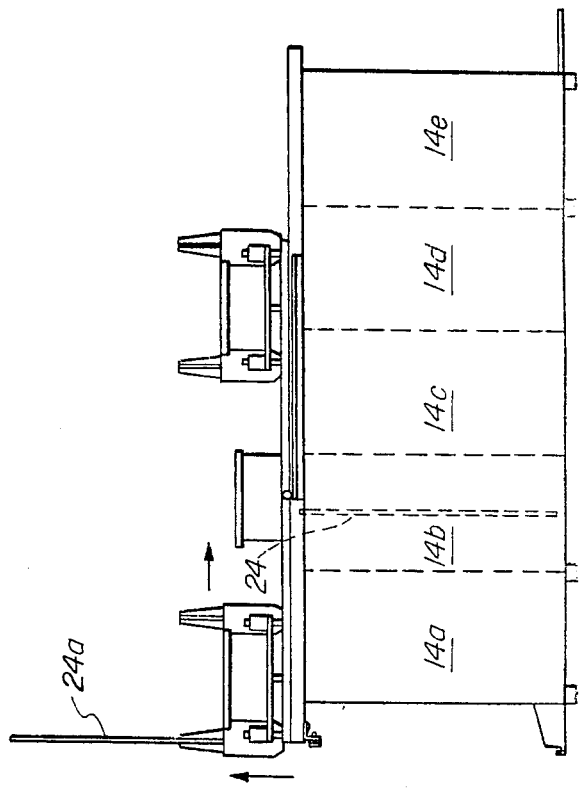

FIG 6.m

METHOD AND APPARATUS FOR TRANSPORTING CIRCUIT OR OTHER WORK UNITS BEING PROCESSED

BACKGROUND OF THE INVENTION

1. Field of the Invention

This invention relates generally to the art of handling work to be processed in a series of successive processing operations performed in successive work processing stations. The invention relates more particularly to a novel work handling method and apparatus for this purpose and especially for transporting printed circuit boards through successive liquid baths of acid, rinse solution, flux, solder, and hot oil to solder coat or plate the circuit board conductors and thru-holes and then remove excess solder from the boards.

2. Discussion of the Prior Art

As will appear from the ensuing description, the work handling method and apparatus of the invention may be used for a variety of work processing applications involving movement of work to be processed through a series of successive work processing stations. The work processing operations or actions which occur or are performed in these stations can vary considerably from one application to another. A present, particularly useful application, however, involves processing printed circuit boards to coat or plate the exposed circuit board conductors and thru-holes, if any, with solder to facilitate attachment of circuit elements to the boards. For this reason, the invention will be described in the context of such circuit board processing. The term solder as used herein is intended to cover any and all conductive bonding materials which may be used for the purpose described.

Printed circuit boards are well known and widely used in the electronics industry to facilitate electrically connecting multiple electrical circuit elements, such as resistors, capacitors, transistors, integrated circuit elements, and the like in preselected electrical circuit configurations. Simply stated, a printed circuit board comprises an insulating substrate with an exposed pattern of conductors of copper or the like on at least one side to which circuit elements may be electrically connected. Many circuit boards have one or more additional levels of such conductive patterns and plated thru-holes which electrically connect the different levels in such a way as to establish the desired circuit configurations on the circuit boards.

In order to facilitate electrical connection of circuit elements to the exposed conductors of a circuit board and to electrically connect different levels, if any, of conductors in the board via circuit board thru-holes, the exposed conductors and thru-holes are coated or plated with solder. Solder coating or plating the conductors and thru-holes of a circuit board involves a series of processing steps. These are (1) acid cleaning the exposed conductors, (2) rinsing the board to remove any remaining acid, (3) applying flux to the cleaned conductor surfaces, (4) coating or plating the fluxed conductor surfaces with solder and removing excess solder from the board, and (5) washing the boards.

In the past, these solder coating or plating steps have commonly been performed in essentially independent operations involving different methods of handling the circuit boards in the different steps. In many cases, the boards are stacked between the successive operations. As a result, the existing circuit board processing operations for solder coating or plating their conductors are time consuming, costly, and otherwise ill-suited to present day circuit board mass production requirements.

SUMMARY OF THE INVENTION

According to its broader aspects, the invention provides work handling means for work processing apparatus having a series of work processing stations. The work handling means comprises work transport means for moving the work along a path extending past the work processing stations to successive positions along the path opposite the work stations, respectively. At each of these positions, the work is extended laterally of the path into the respective work processing station for processing of the work in the station and then retracted from the station for movement along the path to the next work processing station. According to a feature of the invention, the transport means is selectively operable to engage and release the work to be processed and to pick up work at a work infeed station, transport the work through the processing stations, and deposit the processed work at a work outfeed station.

In the presently preferred embodiment of the invention, the work transport means comprises at least one, and in actual applications several, rack-like holders for the work to be processed and a transport mechanism for transporting each work holder, and thereby also work carried by the work holder through the work processing stations. The transport mechanism includes a carriage movable along a path extending past the work processing stations, means to support each work holder on the carriage for extension and retraction laterally of the carriage path and toward and away from the processing stations, carriage actuating means for driving the carriage to successive positions along its path wherein each work holder on the carriage is aligned with a work processing station, and work holder actuating means for extending and retracting each holder on the carriage into and from the aligned work processing station.

This preferred embodiment has a work infeed station preceeding the work processing stations and a work outfeed station following the processing stations. Work holders containing work to be processed are delivered in succession to the infeed station. The carriage and work holder actuating means are operable in timed relation to sequentially drive the carriage between an infeed position adjacent the infeed station and an outfeed position adjacent the outfeed station, engage a work holder at the infeed station with and retract the holder relative to the carriage, drive the carriage to successive positions along its path of movement and at each position extend and/or retract work holders into and/or from aligned work processing stations for processing of the work carried by the holders in the respective stations, and finally deposit the work holders at the outfeed station.

As noted earlier, the disclosed embodiment of the invention is designed to process printed circuit boards by coating or plating their conductors and thru-holes with solder. In this described embodiment, the work processing stations comprise upright tanks for containing the liquid baths mentioned earlier which are utilized to solder coat or plate circuit board conductors and thru-holes. These liquid baths comprise an initial acid bath for cleaning the conductor and thru-hole surfaces, a following liquid rinse bath such as water, a following liquid flux bath, a following liquid solder and hot oil bath for solder plating the circuit board conductors and removing excess solder from the circuit boards, and a final water bath for removing the oil from the boards.

The work holder transport carriage of the illustrated circuit board processing or solder plating apparatus moves along a horizontal path extending over these circuit board processing liquid tanks. The circuit boards are carried by relatively flat rack-like holders with the circuit boards substantially coplanar with their holders. Each holder on the carriage is movable vertically edgewise relative to the carriage and is extended downwardly into and retracted upwardly from the underlying processing tank by the corresponding work holder actuating means. The particular work holder transport carriage illustrated has four holder actuating means spaced along the carriage which receive and actuate each work holder in sequence in a manner to move the holder from the work infeed station, through the successive processing tanks, to the work outfeed station.

BRIEF DESCRIPTION OF THE DRAWINGS

FIG. 1 is a perspective view of a work processing apparatus, specifically a circuit board solder plating apparatus, according to the invention;

FIG. 1a is a fragmentary section view, partially broken away, of the apparatus;

FIG. 2 is an enlarged section taken on line 2—2 in FIG. 1;

FIG. 3 is an enlarged section taken on line 3—3 in FIG. 1;

FIG. 4 is an enlarged fragmentary side elevation of the apparatus;

FIG. 4a is an enlarged fragmentary section of a portion of the apparatus.

FIG. 5 is a section taken on line 5—5 in FIG. 4;

DESCRIPTION OF THE PREFERRED EMBODIMENT

Figure 6A:
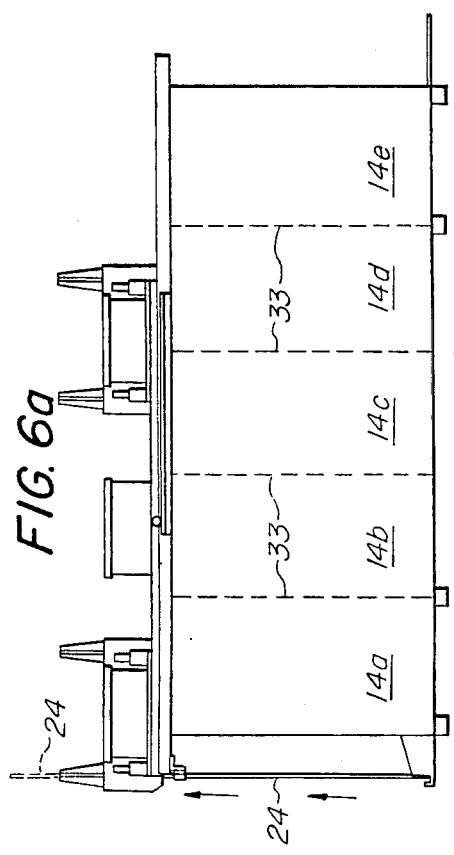
FIGS. 6a–6n illustrate the operation of the apparatus.

Turning now to these drawings, the illustrated work processing apparatus 10 has a work infeed station 12, a following series of successive work processing stations 14, a work outfeed station 16, and work transport means 18 for transporting work 20 to be processed from the infeed station 12, through the processing stations 14 in succession, to the outfeed station 16. The work transport means 18 picks up work from the infeed station 12, moves the work along a path 22 extending past all of the stations 12, 14, 16 and to successive positions along this path where the work is aligned with the processing stations 14, respectively. At each of these positions, work is extended laterally of the path 22 into the adjacent processing station(s) 14 for processing of the work therein. Thereafter, the work is retracted from the stations, and then moved along the path to the next processing station. The completely processed work is deposited at the outfeed station.

To this end, the work transport means 18 comprises work holders 24 to be placed in an infeed position at the infeed station 12, a carriage 26 movable along the path 22 for transporting the work holders 24 in succession from the infeed station, past the work processing stations 14, to the outfeed station 16, carriage actuating means 28 for driving the carriage 26 along the path, and work holder actuating means 30 for engaging the work holders 24 with the carriage 26 at the infeed station, extending and retracting the work holders into and from the work processing stations at successive positions of the carriage along the path, and releasing the work holders from the carriage at the outfeed station.

Referring now in more detail to the drawings, the illustrated work processing apparatus 10 is designed to process electrical circuit boards to coat their conductors and thru-holes with solder. These circuit boards comprise the work 20. As noted earlier, however, and as will become evident from the ensuing description, the illustrated apparatus may be used for other work processing applications.

The illustrated processing apparatus has a large hollow rectangular base 32 with internal vertical partitions 33 perpendicular to the carriage path 22 forming a number of liquid tanks within the base. These tanks constitute the work processing stations 14 and are individually designated 14a–14c. During operation of the apparatus, these tanks contain work processing liquids to be discussed later. Each tank contains vertical guides 34 disposed in a vertical plane normal to the carriage path 22 for receiving the work holders 26 in the manner explained later.

The work carriage 26 comprises a rigid carriage base 36 including a pair of bars 38 extending lengthwise of the carriage and a housing 40 extending between and rigidly joining the bars midway between their ends. At opposite ends of the bars 36 are two additional housings 42, 44. Fixed to these end housings at their corners are bearing sleeves 46 which slide on upstanding bearing posts 48 rigid on the carriage bars 36. The bearing sleeves 46 and posts 48 support the two end housings 42, 44 on the carriage base 36 for vertical movement relative to the base. Each housing 40, 42, 44 has a removable cover 50.

Rigidly secured to the top of the apparatus base 32 along its longitudinal sides are two tracks 52. These tracks extend the full length of and a small distance beyond the ends of the base 32. The carriage side bars 38 are spaced to directly overlie the base tracks 52. Mounted on the carriage bars 38 are rollers or wheels 54 which ride on the tracks 52 to support the work carriage 26 for movement along the base 32 over and past the base tanks 14a–14e. Suitable guide means (not shown) are provided for restraining the carriage against lateral and angular movement relative to the tracks and thereby guide the carriage for pure endwise movement along the tracks.

As noted before, the illustrated work 20 comprises printed circuit boards whose exposed conductors and thru-holes are solder coated in the illustrated apparatus. Each work piece 20 comprises a rectangular circuit board substrate 20a containing multiple printed circuits 20b. These printed circuit work pieces are conventional and need not be described nor are they illustrated in detail. Suffice it to say that the printed circuits 20b have at least an exposed printed conductor pattern on one side of the substrate 20a and often several internal layers of conductor patterns to be electrically joined to one another and to the surface conductors via solder plated thru-holes in the substrate. The present apparatus is designed to solder coat or plate the exposed surface conductors and thru-holes, if any.

Each work holder 24 holds a single printed circuit work piece 20. The holder comprises essentially a relatively thin and flat open rectangular frame including a pair of perforated side strips 56 rigidly joined at one end and between their ends by cross plates 58. The side strips 56 have uniformly spaced holes 60 whose purpose will be explained presently.

A printed circuit work piece 20 to be processed is mounted on the holder 24 within the open space bounded by the two side strips 56 and the two cross plates 58. To this end, the side strips 56 mount clips 62 along their inner edges between the cross plates 58 for gripping a printed circuit work piece 20a in the manner shown in FIG. 2.

As mentioned earlier, the work holder 24 is adapted to occupy an infeed position at the work infeed station 12. This infeed position is the position occupied by the work holder in FIG. 1. The work holder is supported in this infeed position by support means 64 on the end of the base 32 adjacent the first work processing tank 14a. Support means 64 comprises a lower support 66 and an upper guide 68. The lower support 66 comprises a channel member 70 rigidly mounted near the bottom of the base 32. This channel member has an upwardly opening channel in a vertical plane normal to the carriage path 22 for receiving the lower end of the work holder 24 in the manner shown in FIG. 1.

The upper work holder guide 68 comprises a pair of perforated strip guides 72 mounted on the base 32 adjacent its top. These strip guides 72 comprise a bracket 74 rigidly secured to the base and having a vertical flange 76 to which are bolted outer guide members 78. The bracket flange 76 and guide members 78 form intervening guideways 80 which are disposed in the vertical plane of the lower work holder support channel. These guideways are sized and spaced to slidably receive the outer longitudinal edge portions of the perforated work holder strips 56 in the manner shown in FIGS. 1 and 3. These work holder strips have a length such that when a work holder 24 is supported in infeed position by the lower work holder support 66, the upper ends of the strips extend through the guideways and a short distance above the upper strip guides 68, as shown in FIG. 4.

As mentioned earlier, the work processing apparatus 10 has carriage actuating means 28 for driving the work carriage 26 along its path 22 of movement and work holder actuating means 30 for engaging and disengaging a work holder 24 with and from the carriage and extending and retracting the work holder relative to the carriage into and/or from the infeed, work processing, and outfeed stations 12, 14, 16. These actuating means will now be described.

The carriage actuating means 28 comprises a pair of gear racks 82 secured to the outer sides of the carriage tracks 52 about midway between the ends of the tracks. Meshing with these racks are carriage drive gears 84 mounted on opposite ends of a drive shaft 86 rotatably mounted in and extending through the center carriage housing 40 normal to the direction of carriage movement. Shaft 86 is driven by a reversible motor 88 (FIG. 7) through a gear reduction 90 (FIG. 7), all within the center carriage housing 40. As will be explained presently, the carriage actuating means 28 drives the carriage 26 back and forth over the base 32, along the path 22, in the manner depicted in FIGS. 6a–6i.

The work holder actuating means 30 comprises work holder actuating mechanisms 92, 93 at opposite ends of the carriage 26. These two actuating mechanisms are identical so that a description of one will suffice for both. The actuating mechanism to be described is the left hand mechanism 92 in FIG. 1 which is best shown in FIGS. 4 and 5.

The work holder actuating mechanism 92 comprises a pair of essentially identical work holder actuators 94 and 96 and a work holder engage/disengage means 98.

The left hand work holder actuator 94 in FIGS. 1, 4 and 5 comprises work holder guides 100 mounted on the inner confronting sides of left hand extensions 102 of the adjacent, left hand carriage housing 42. These guides extend from the bottoms of the housing extensions 102 to a substantial distance above the extensions and form work holder guideways 104 along their entire length. These guideways are disposed in a common vertical plane normal to carriage path 22 and are sized in width to slidably receive the outer longitudinal edges of the perforated side strips 56 of the work holder 24.

Extending horizontally between the housing extensions 102 at opposite sides of and parallel to the vertical plane of the guideways 104 are a sprocket shaft 106 and an idler or back up shaft 108. These shafts are rotatably supported at their ends in bearings mounted in the housing extensions 102. Sprocket shaft 106 mounts sprockets 110 and adjacent cylindrical roller portions 112. Idler shaft 108 has smaller diameter roller portions 114 opposite the sprockets 110 and larger diameter roller portions 116 opposite the sprocket shaft roller portions 112.

The teeth of sprockets 110 project radially across the vertical plane of the guideways 104. The smaller idler shaft roller portions 114 are just slightly spaced from the opposing sprocket teeth. The sprocket shaft roller portions 112 and larger diameter idler shaft roller portions 116 are tangent to opposite sides of the vertical plane of the guideways 104. As will be seen, the holes 60 in the work holder perforated side strips 56 and the teeth of sprockets 110 are sized and spaced for meshing engagement of the sprockets with the strips in the manner explained later.

Mounted within the carriage housing 42 is a reversible motor 118 for driving the sprocket shaft 106. Motor 118 is coupled to the shaft through a gear train 120.

The other work holder actuator 96 of the actuating mechanism 92 is essentially identical to actuator 94 and its numbered parts are designated by the same reference numerals as their counterparts in the actuator 94. Accordingly, a detailed description of actuator 96 is unnecessary. Suffice it to say that actuator 96 has vertical work holder guideways 104, sprocket and idler shafts 106, 108 at opposite sides of the vertical plane of the guideways 104, and a reversible motor 118 in the housing 42 for driving the sprocket shaft.

The work holder engage/disengage means 98 comprises a shaft 122 extending horizontally through the carriage housing 42 approximately in a vertical medial plane of the housing normal to the carriage path 22. The ends of the shaft 122 are rotatably supported in the housing and mount pinions 124. These pinions mesh with vertical upstanding racks 126 which are rigidly fixed at their lower ends to the side bars 38 of the rigid carriage base 36 and extend upwardly through the bottom and into the interior of the housing 42. Mounted within the housing 42 is a reversible drive motor 128 which is coupled to the shaft 132 by a gear train 130.

As noted earlier, the two work holder actuating mechanisms 92, 93 are identical. Accordingly, the foregoing description of the actuating mechanism 92 applies equally to the actuating mechanism 93. For this reason, in the ensuing description, corresponding parts of the two mechanisms are referred to by the same reference numerals.

From the description to this point, it will be understood that the carriage drive motor 88 is operable to drive the work carriage 26 in either direction along the path 22 and across the work processing tanks 14a-14e. The work holder actuator motors 118 are operable to drive their respective sprocket shafts 106 in either direction of rotation. Each work holder engage/disengage motor 128 is operable to drive the pinion shaft 122 in either direction of rotation to raise and lower the respective carriage housing 42, 44, and thereby also the work holder actuators 94, 96 and engage/disengage means 98 carried by the housing, relative to the carriage base 36. Carriage housing 42 is thus vertically movable between its solid and broken lines in FIG. 4. Carriage housing 44 is similarly vertically movable by its work holder engage/disengage means 98.

The operation of the work processing apparatus 10 will now be described by reference to FIGS. 4 and 6a-6i assuming an initial condition in which there are no work holders 24 in the apparatus. In the following description, reference will be made to driving the carriage 26 along its path 22, driving of the sprocket shafts 106, and raising and lowering the carriage housings 42, 44. It will be understood that these actions are accomplished by appropriate operation of the carriage drive motor 88, actuator motors 118, and work holder engage/disengage motors 128, as the case may be.

The apparatus is conditioned for operation by placing a work holder 24, mounting work 20 to be processed, in its infeed position of FIG. 1 in which the holder is held in the infeed support means 64 at the infeed station 12. Thereafter, during operation of the apparatus, additional work holders 24 are placed one by one in the support means 64 as the previous holder is picked up and moved through the apparatus in the manner explained below. Obviously a suitable infeed mechanism could be provided for delivering work holders one by one to the infeed station.

It is significant to note at this point that when a work holder 24 is supported in its infeed position of FIGS. 1 and 4, the upper ends of its perforated side strips 56 project a distance above the upper work infeed guides 68, as shown in FIG. 4. The carriage housing 42 is movable vertically relative to the carriage base 36 between a raised position, shown in solid lines in FIG. 4, in which the bottoms of the carriage housing extensions 102 and work holder guides 100 are located above the upper ends of the work holder strips 56 and a lower position shown in broken lines in FIG. 4 and in solid lines in FIG. 4a, in which the housing extensions and work holder guides project below the upper strip ends.

The initial operation of the work processing apparatus 10 involves driving the carriage 26 to its left hand work infeed position of FIGS. 1, 4, 5 and 6a with the carriage housing 42 in its solid line raised position of FIG. 4. In this infeed position, the work holder guideways 104 of work holder actuator 92 are vertically aligned with the perforated side strips 56 of the work holder 24 in infeed position at the infeed station 12.

Figure 7:
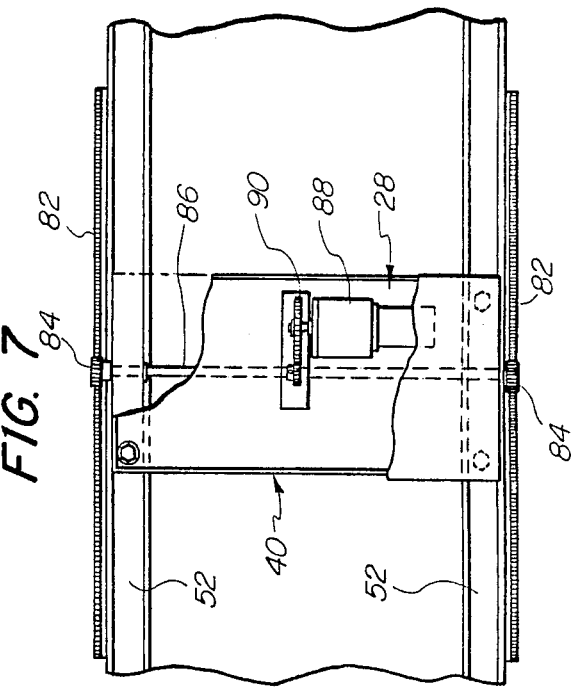
FIG. 7 is a fragmentary top view, partially in section, of the apparatus.

The carriage housing 42 is now lowered to its broken line position of FIG. 4 (solid line positions of FIGS. 1, 4a and 6a). When this occurs, the lower ends of the work holder guides 100 of work holder actuator 94 move down over the upper ends of the work holder side strips 56 and the latter enter the corresponding carriage work holder guideways 104. The strips are of such length that their upper ends enter the guideways 104 sufficiently to mesh with the adjacent sprockets 124, as shown best in FIG. 4a. Being free to turn, since their drive motor 118 is de-energized, the sprockets are rotated through a small angle by the work holder drive strips 56 as the latter enter into meshing engagement with the sprockets.

Figure 6C:
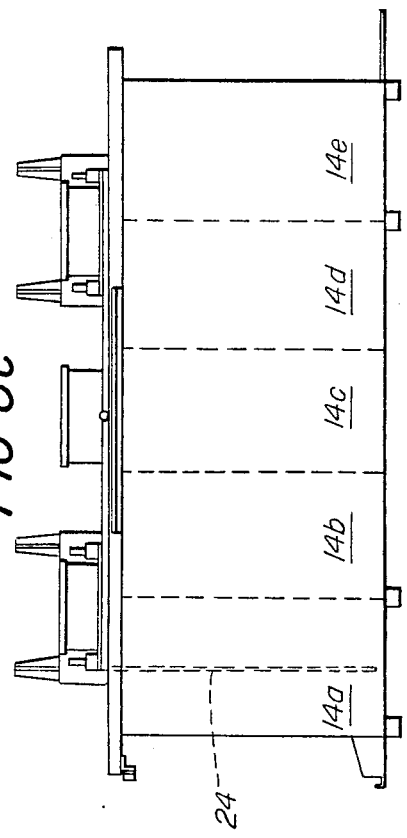
Figure 6B:
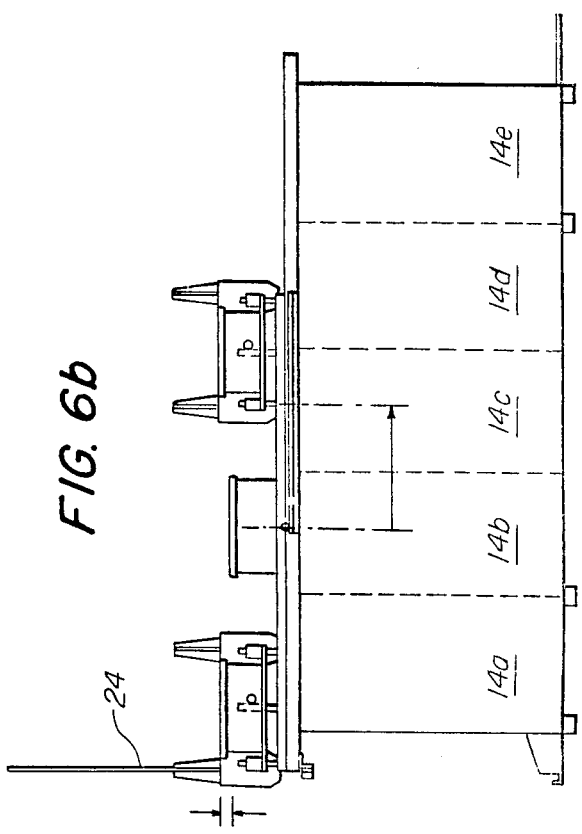

At this point the sprocket drive motor 118 of actuator 94 is energized to drive the sprockets 124 in a direction to elevate the engaged work holder 24 from its infeed position in the infeed work holder support 64 to the elevated position on the carriage 26 shown in FIG. 6b. In this position, the bottom of the work holder is substantially flush with the bottoms of the carriage housing extensions 102. The carriage housing 42 is then raised to its solid line position of FIG. 4.

The carriage 26 is now driven to the right to its position of FIG. 6c wherein the work holder 24 is vertically aligned with the work holder guides 34 in the first work processing tank 14a. This carriage position is hereafter referred to as its intermediate position. At this point, the carriage housing 42 is lowered to its position of 6c (broken line position of FIG. 4) and the sprocket drive motor 118 of actuator 94 is energized to lower the work holder 24 into the tank 14a with the holder engaging the holder guides 34 in the tank.

It is significant to note at this point that the tank work holder guides 34 are arranged to support the work holder 24 in a vertical plane parallel to the vertical planes of the work holder guideways 104 on the carriage 26 and in the same vertical position relative to the carriage as was the work holder in its infeed position at the infeed station 12. As a consequence, when the work holder 24 is fully lowered into the tank 14a, the upper ends of its perforated drive strips 56 are still disposed in meshing engagement with the sprockets 110 of the work holder actuator 94, in the same manner as shown in FIG. 4a.

At this point, therefore, two alternative machine operations are possible. Thus, the carriage housing 42 can be raised with the sprocket drive motor 118 of actuator 94 deenergized. Under these conditions, the actuator sprockets 110 will rotate out of meshing engagement with work holder drive strips 56 as the carriage housing 42 raises, thereby leaving the work holder 24 in the tank 14a.

Alternatively, the actuator drive motor 118 can be energized to elevate the work holder 24 out of the tank 14a and then the carriage housing 42 raised in essentially the same way as when the work holder was initially picked up at the infeed station. Under these conditions, the work holder is removed from the tank.

Thus, the work holder actuator 94 and the work holder engage/disengage means 98 are selectively operable to lower the work holder into the tank and to either immediately remove the work holder from the tank or leave it in the tank. This applies equally to all of the work holder actuators and their engage/disengage means and to all of the processing tanks 14a-14c. In the following additional operating description of the apparatus, this action of the actuators and engage/disengage means will not be repeated in detail but merely stated in functional terms. Moreover, in every operating position of the carriage 26, its work holder guideways 104 will be aligned with the work holder guides 34 in the adjacent tanks 14a-14c or with the infeed guide 64. This alignment will not be repeated in the following description.

Figure 6D:
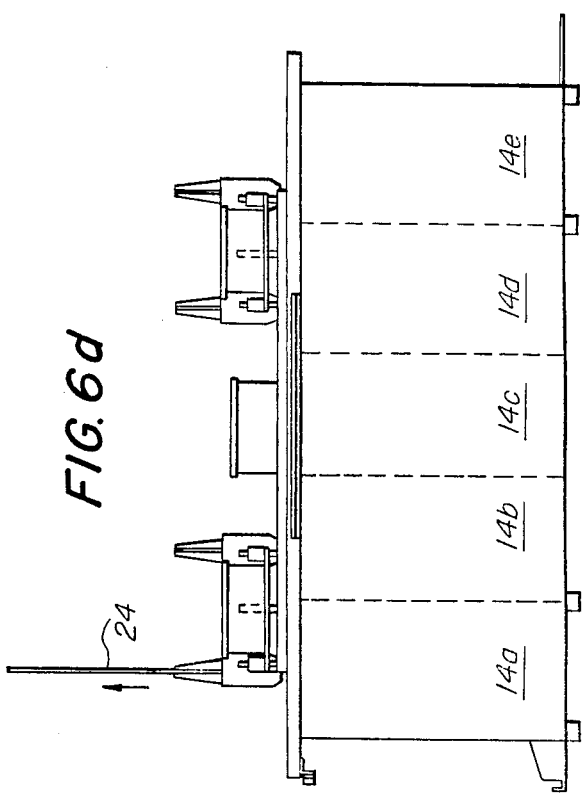

With this in mind, it will be recalled that the processing apparatus is currently in an operating state in which the carriage 26 occupies its intermediate position of FIG. 6c with the work holder 24 lowered into the first processing tank 14a. In the particular apparatus shown, the work holder is immediately withdrawn from the first tank 14a as shown in FIG. 6d, and the carriage is driven to its position of FIG. 6e. This position is hereafter referred to as the outfeed position for reasons to be seen as the description proceeds.

In this outfeed position, the work holder 24 currently on the carriage 26 is aligned with the second processing tank 14b (i.e., with the guides 34 in the tank). At this point, the work holder 24 is lowered into the second tank and left there. The carriage is then driven back to its infeed position, as shown in FIG. 6f, to pick up a second work holder 24a from the infeed station 12.

While the carriage 26 is in this infeed position, the second work holder 24a is engaged and raised from its infeed position at the infeed station 12 to its elevated position on the carriage, as shown in FIG. 6f. The carriage is then driven to its intermediate position, as shown in FIG. 6g. The second work holder 24a is then lowered into the first processing tank 14a, after which both work holders 24 and 24a are removed from their respective tanks 14b, 14a. The carriage 26 is then to its outfeed position as shown in FIG. 6h.

Figure 6I:
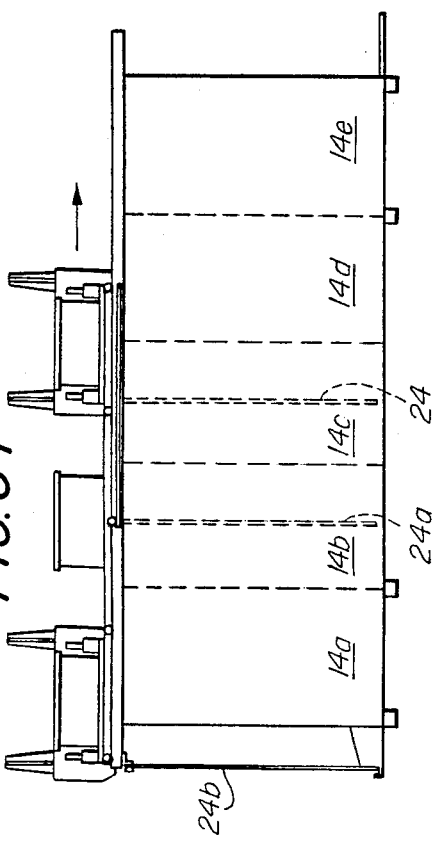

In this outfeed position of the carriage 26, the two work holders 24, 24a currently on the carriage are aligned with processing tanks 14c, 14b, respectively. The work holders are lowered into these tanks and left there, after which the carriage is returned to its infeed position to pick up a third work holder 24b from the infeed station 12, as shown in FIG. 6i. Work holder 24 is engaged and removed from its current processing tank 14c concurrently with engagement and removal of the third work holder 24b from the infeed station 12.

Figure 6K:
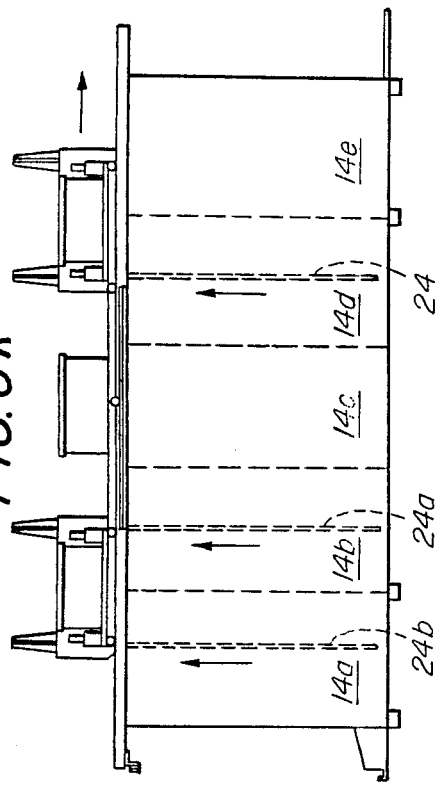
Figure 6J:
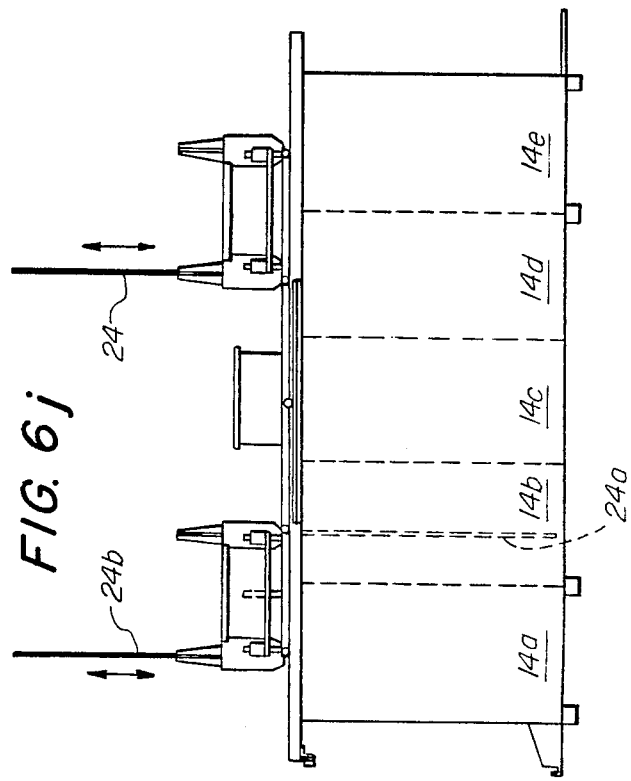
Figure 6L:
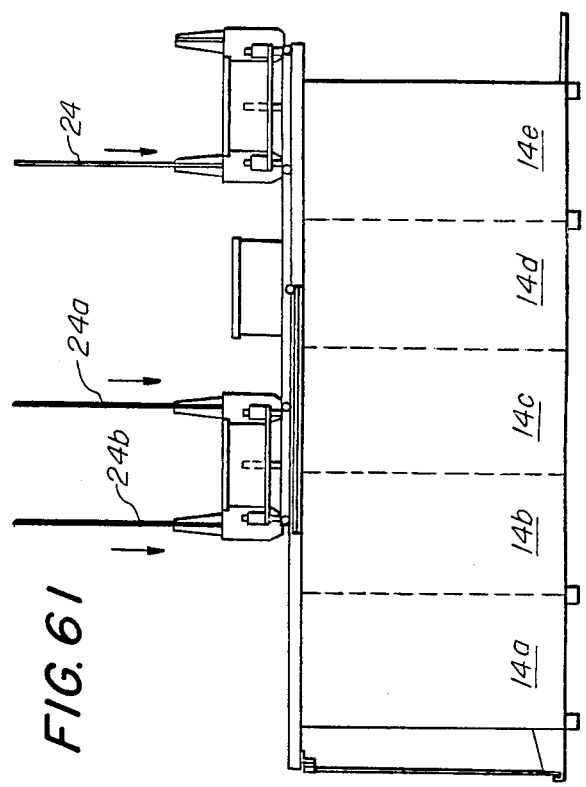

The carriage 26 with the two work holders 24, 24b is then driven to its intermediate position, as shown in FIG. 6j. At this point, the work holders 24, 24b are lowered into the processing tanks 14d, 14a, respectively, after which all three work holders 24, 24a, 24b are withdrawn from their tanks, as indicated by the arrows in FIG. 6k. The carriage 26 with the three work holders is then driven to its outfeed position, as shown in FIG. 6l. At this point, the work holders are lowered into and left in the processing tanks 14b, 14c, 14e, respectively. The carriage 26 is returned to its infeed position, as depicted in FIGS. 6m and 6n to pick up a fourth work holder 24c from the infeed station 12.

Figure 6P:
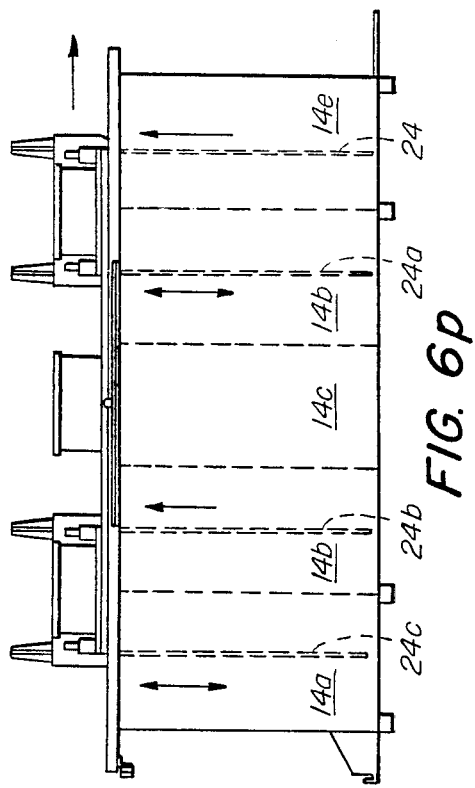
Figure 6N:
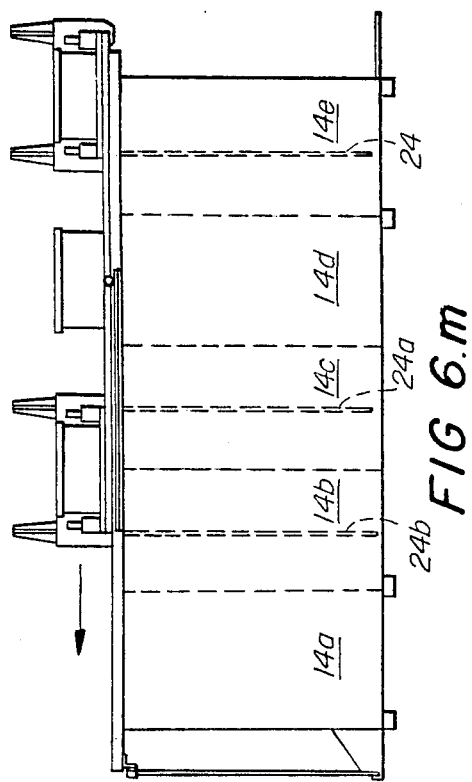
Figure 6N:
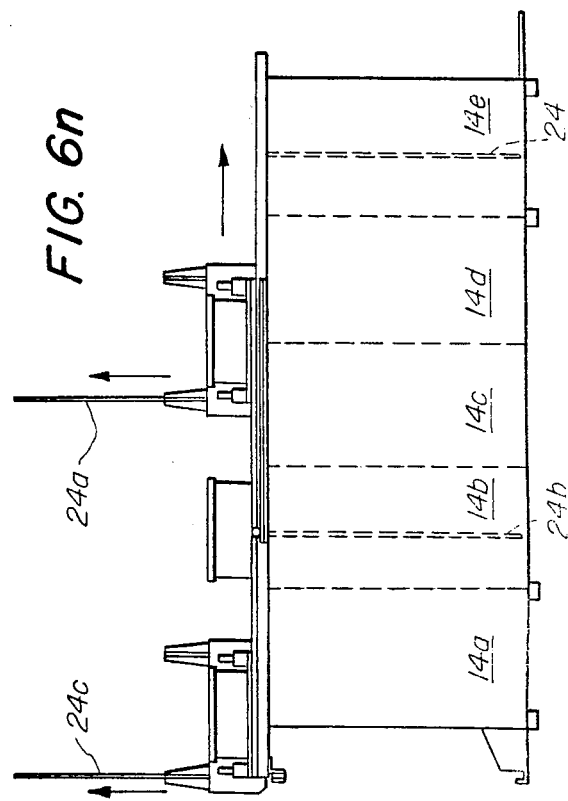

While the carriage 26 is at its infeed position, the fourth work holder 24c and the work holder 24a are engaged and raised to elevated positions on the carriage, as shown in FIG. 6n. The carriage is then driven to its intermediate position, as shown in FIG. 6p, where the work holders 24c, 24a are lowered into tanks 14a, 14d, respectively. All four work holders 24c, 24b, 24a, 24 are then withdrawn from their tanks, and the carriage with all four work holders is then driven to its outfeed position. While at the outfeed position, the work holder 24 is released to the outfeed station 16 and the remaining three work holders 24c, 24b, 24a are lowered into and left in the processing tanks 14b, 14c and 14e. The carriage 26 is then driven back to its infeed position to pick up a fifth work holder (not shown).

It will now be understood that the carriage 26 is driven through recurrent cycles involving intermittent movement of the carriage along the path 22 from its infeed position, to its intermediate position, to its outfeed position, and then back to its infeed position. The work holder actuating means 30 operates in timed relation to this carriage movement to pick up work holders 24 at the infeed station, extend and retract each work holder into and from the work processing tanks 14 in succession, and finally deposit the work holders at the outfeed station 16.

As mentioned earlier and will now be evident, the tanks 14 may contain various work processing liquids for performing various processing operations on the work 20. The particular work shown are printed circuit boards having exposed conductors and thru holes to be solder plated. In this case the tanks 14 contain an acid solution for removing oxidation from the conductors (tank 14a), a rinse liquid such as water for rinsing off the acid solution (tank 14b), a liquid flux solution (tank 14c), liquid solder (tank 14d), and a final wash solution. As the circuit boards are withdrawn from the liquid solder tank 14d, water soluble oil is sprayed against the boards, as described in my pending patent application Ser. No. 417,428, to remove excess solder from the boards. Oil remaining on the boards is removed in the final wash tank 14e.

According to the preferred practice of the invention, the apparatus 10 is controlled by a computer 200 which is programmed to effect the several cyclic operations described herein. To this end, the apparatus is equipped with suitable sensors for sensing the carriage position, and the vertical positions of the carriage housings 40, 42, 44.

The inventor claims:

1. In a processing apparatus for electrical circuit boards, the combination comprising:
   a row of successive circuit board processing stations,
   a circuit board infeed station at one end of said row and a circuit board outfeed station at the other end of said row,
   transport means for picking up circuit boards to be processed from said infeed station, transporting the circuit boards through said processing stations in succession for processing of the circuit boards at each station, and depositing the processed circuit boards at said outfeed station, and wherein:
   said transport means transports circuit boards from said infeed station to said outfeed station along a path extending along and laterally spaced from said station row to successive positions along said path opposite the successive processing stations, respectively, and at each said position moves the circuit boards laterally of said path into the respective station for processing therein and thereafter from the respective station for movement to the next processing station.

2. The combination of claim 1 wherein:
   said processing stations comprise upright tanks for containing circuit board processing liquids,
   said path extends over said tanks, and
   each tank has a top opening through which circuit boards are lowered from said path into the tank and then raised from the tank back to said path.

3. The combination of claim 2, wherein:
   said circuit boards have an insulating substrate and metallic conductors on the substrate, and
   said tanks are adapted to contain liquid baths of acid, rinse solution, flux, solder, and wash solution for solder coating said conductors.

4. In a work processing apparatus for electrical circuit boards, the combination comprising:

a row of successive circuit board processing stations, transport means for transporting circuit boards to be processed through said processing stations in succession, and wherein:

the transport means comprises a carriage movable back and forth along a path extending past said stations, guide means on said carriage to support circuit boards for extension and retraction relative to said carriage laterally of said path and toward and away from said station row, carriage actuating means for driving said carriage along said path, circuit board actuating means for extending and retracting carriage supported circuit boards relative to said carriage as well as selectively engaging and releasing circuit boards at each station, and said actuating means are operable in timed relation to drive said carriage to successive positions along said path where carriage supported circuit boards are located opposite said stations, respectively, and to selectively engage, release, extend, and retract circuit boards at each said position.

5. The combination of claim 4, wherein:

said processing stations comprise upright tanks for containing processing liquids, said path extends over said tanks, and each tank has a top opening through which circuit boards are extended downwardly from said path into the tank and then retracted upwardly from the tank back to said path.

6. The combination of claim 5, wherein:

said circuit boards have an insulating substrate and metallic conductors on the substrate, and said tanks are adapted to contain liquid baths of acid, rinse solution, flux, solder, and wash solution for solder coating said conductors.

7. The combination of claim 4, including:

a circuit board infeed station at one end of said row for receiving circuit boards to be processed and a circuit board outfeed station at the other end of said row for receiving processed circuit boards, and wherein:

said circuit board actuating means comprise a plurality of circuit board actuating mechanisms spaced along said carriage, and said carriage actuating means and said circuit board actuating mechanisms are operable in timed relation to pick up circuit boards from said infeed station with one actuating mechanism, transfer the circuit boards from one actuating mechanism to another during the course of movement of the circuit boards through said processing stations, and release the circuit boards from one actuating mechanism to said outfeed station.

8. The combination according to claim 4, including:

a circuit board infeed station at one end of said row for receiving circuit boards to be processed and a circuit board outfeed station at the other end of said row for receiving processed circuit boards, and wherein:

said circuit board actuating means comprise a plurality of circuit board actuating mechanisms spaced along said carriage and including two actuating mechanisms at opposite ends of said carriage, said carriage is movable back and forth along said path between an infeed position wherein one of said end actuating mechanisms is disposed to pick up circuit boards from said infeed station and an outfeed position wherein the other end actuating mechanism is disposed to deliver processed circuit boards to said outfeed station, and said carriage actuating means and said circuit board actuating mechanisms are operable in timed relation to transfer circuit boards from said one end actuating mechanism to the other end actuating mechanism during the course of movement of circuit boards through said processing stations.

9. The combination of claim 8, wherein:

said circuit boards are deposited in certain processing stations by certain actuatiang mechanisms and picked up from such certain stations by other actuating mechanisms to effect transfer of said circuit boards from one actuating mechanism to another.

10. The combination of claim 9, wherein:

said processing stations comprise upright tanks for containing circuit board processing liquids, said path extends over said tanks, and each tank has a top opening through which circuit boards are extended downwardly from said path into the tank and then retracted upwardly from the tank back to said path.

11. The combination of claim 10, wherein:

said circuit boards have an insulating substrate and metallic conductors on the substrate, said tanks are five in number and adapted to contain liquid baths of acid, rinse solution, flux, solder, and wash solution for solder coating said conductors, and said actuating mechanisms are four in number and generally uniformly spaced along said carriage.

12. In a processing apparatus for electrical circuit boards, the combination comprising:

a row of successive cirucit board processing stations, a circuit board infeed station at one end of said row for receiving circuit boards to be processed and an outfeed station at the other end of said row for receiving processed circuit boards, flat rectangular racks for holding circuit boards to be processed, each rack being adpated to occupy an initial infeed position at said infeed station, transport means for picking up said circuit board racks in succession at said infeed station, transporting each rack from said infeed station through said processing station in succession to said outfeed station, and wherein:

said transport means comprises a carriage movable back and forth along a path extending past said stations, carriage actuating means for driving said carriage along said path, guide means on said carriage to support racks for edgewise extension and retraction relative to said carriage and toward and away from said station row in planes substantially normal to said path, rack actuating means on said carriage for selectively extending, retracting, engaging, and releasing racks supported in said guide means, and means for operating said carriage and rack actuating means in timed relation to drive said carriage to successive positions along said path where guide supported racks on said carriage are located opposite said stations, respectively, and to selectively engage, release, extend, and retract racks at each position.

13. The combination of claim 12, wherein:

said rack actuating means comprise rotary shaft means peripherally engagable with said racks to feed the racks edgewise upon rotation of said shaft means.

14. The combination of claim 13, wherein:
said rotary shaft means comprise sprocket shaft means having teeth engagable with said racks.

15. The combination of claim 12, wherein:
said rack actuating means further comprise means for bodily moving said guide means and said rack actuating means as a unit toward and away from said row to selectively engage and release racks in said stations.

16. The combination of claim 15, wherein:
said rack actuating means comprise sprocket shaft means having teeth engagable with said racks to feed said racks edgewise upon rotation of said shaft means.

17. The combination of claim 16, wherein:
said rack actuating means further comprise rotary backup shaft means opposite said sprocket shaft means to receive said racks therebetween.

18. The combination of claim 15, wherein:
said rack actuating means and rack guide means form a plurality of rack actuating mechanisms spaced along said carriage, each including a rack guide and a rack actuating means,
said actuating mechanisms including two actuating mechanisms at opposite ends of said carriage, and
said carriage actuating means and rack actuating mechanisms are operable in timed relation to pick up each rack from said infeed station with one end actuating mechanism, transfer the rack from one actuating mechanism to the next during the course of movement of the rack through said processing stations, and release the rack from the other end of the actuating mechanism to said outfeed station.

19. The combination of claim 18, wherein:
said racks are deposited in certain processing stations by certain actuating mechanisms and picked up from said certain stations by other actuating mechanisms to effect said transfer of racks from one actuating mechanism to another.

20. The combination of claim 19, wherein:
said processing stations comprise upright tanks for containing circuit board processing liquids,
said path extends over said tanks, and
each tank has a top opening through which circuit boards are extended downwardly from said path into the tank and then retracted upwardly from the tank back to said path.

21. The combination of claim 20, wherein:
said circuit boards have an insulating substrate and metallic conductors on the substrate, and
said tanks are adapted to contain liquid baths of acid, rinse solution, flux, and wash solution for solder coating said conductors.

22. An apparatus for processing electrical circuit boards having metallic conductors formed on a substrate, comprising:
a base including a row of tanks for containing acid, rinse solution, flux, solder, and wash solution, respectively, in which the circuit boards are adapted to be immersed in succession to solder coat the conductors,
a circuit board infeed station at one end of said row for receiving circuit boards to be solder coated and a circuit board outfeed station at the other end of said row for receiving solder coated circuit boards,
a carriage movable back and forth on said base over and along a path extending along said row of tanks,
generally flat rectangular racks for holding circuit boards to be solder coated,
means at said infeed station for receiving racks in succession and supporting each rack in a generally vertical position normal to said path,
a plurality of rack guides spaced along said carriage for supporting racks in generally vertical positions normal to said path and including cue guides at opposite ends of said carriage,
carriage actuating means for driving said carriage back and forth along said path between an infeed position where one bracket end guide is aligned with said infeed rack support means and the other rack guides are aligned with certain tanks, and an outfeed position where the other bracket end guide is aligned with said outfeed station and the other bracket guides are aligned with certain tanks, and through intermediate positions where said rack guides are all aligned with tanks,
rack actuating means including rack actuators on said carriage adjacent said guides, respectively, engagable with racks in said guides for extending and retracting the racks edgewise relative to said carriage and into and from said tanks in said carriage positions, and rack engage/disengage means for raising and lowering said carriage relative to said base to engage the actuator adjacent said one end guide with a rack at said infeed station and to selectively release and engage racks in said tanks, and wherein:
said carriage and rack actuating means are operable in timed relation to transport each rack from said infeed station, through said tanks in succession, to said outfeed station in such a way that each rack is picked up from said infeed station by the actuator adjacent said one rack end guide, then transferred from one tank to the next and from one actuator to the next, and finally deposited at said outfeed station by the actuator adjacent the other rack end guide.

23. The apparatus according to claim 22, wherein:
said actuators comprise rotary sprocket shafts engagable with said racks for feeding the racks edgewise upon rotation of the sprocket shafts.

24. A circuit board holder for circuit board processing apparatus of the class described, comprising:
an open rectangular frame having parallel perforated side members with uniformly spaced holes theralong, and means on said frame for releasably gripping circuit boards to be processed.

25. A method of processing electrical circuit boards comprising the steps of:
moving circuit boards along a path laterally spaced from and extending along a row of circuit board processing stations and to successive positions along said path opposite said processing stations, respectively, and
at each position moving the circuit board laterally from said path into and from each processing station for processing of the circuit board in the respective station.

26. The method of claim 25, wherein:
each circuit board has a substrate and metallic conductors on the substrate, and
said processing stations contain liquid baths of acid, rinse solution, flux, solder, and wash solution in which each circuit board is successively immersed to solder coat said conductors.

* * * * *